United States Patent
Fann et al.

(10) Patent No.: US 8,537,149 B2
(45) Date of Patent: Sep. 17, 2013

(54) PIXEL ARRAY AND DISPLAY PANEL HAVING THE SAME

(75) Inventors: Sen-Shyong Fann, Taipei County (TW); Yang-Hui Chang, Hsinchu (TW); Shen-Tai Liaw, Hsinchu (TW); Nae-Jye Hwang, Hsinchu (TW)

(73) Assignee: Integrated Digital Technologies, Inc., Hsinchu (TW)

( * ) Notice: Subject to any disclaimer, the term of this patent is extended or adjusted under 35 U.S.C. 154(b) by 294 days.

(21) Appl. No.: 12/981,454

(22) Filed: Dec. 29, 2010
(Under 37 CFR 1.47)

(65) Prior Publication Data
US 2011/0096026 A1    Apr. 28, 2011

Related U.S. Application Data

(63) Continuation-in-part of application No. 11/536,403, filed on Sep. 28, 2006.

(30) Foreign Application Priority Data

Oct. 7, 2005  (TW) ................................ 94135169 A (51) Int. Cl.
*G09G 5/00* (2006.01)

(52) U.S. Cl.
USPC ........... 345/207; 345/173; 345/174; 345/690; 345/55

(58) Field of Classification Search
USPC .............................. 345/207, 173–174, 690, 55
See application file for complete search history.

(56) References Cited

U.S. PATENT DOCUMENTS

| | | | |
|---|---|---|---|
| 4,684,801 | A | 8/1987 | Carroll et al. |
| 4,988,983 | A | 1/1991 | Wehrer |
| 5,638,121 | A | 6/1997 | Hosier et al. |
| 5,705,807 | A | 1/1998 | Throngnumchai et al. |
| 6,046,466 | A | 4/2000 | Ishida et al. |
| 6,350,981 | B1 | 2/2002 | Uno |
| 6,512,547 | B1 | 1/2003 | Miida |
| 6,849,853 | B2 | 2/2005 | Ikeda et al. |
| 6,891,522 | B2 | 5/2005 | Song et al. |
| 6,933,910 | B2 | 8/2005 | Kodate et al. |
| 6,947,102 | B2 | 9/2005 | den Boer et al. |
| 7,002,547 | B2 | 2/2006 | Yamada |
| 7,025,988 | B2 | 4/2006 | Zadi |

(Continued)

FOREIGN PATENT DOCUMENTS

| | | |
|---|---|---|
| EP | 0679869 | 11/1995 |
| EP | 1195576 | 6/2008 |
| JP | 4013360 | 1/1992 |
| JP | 06-011645 | 1/1994 |
| JP | 2000-162041 | 6/2000 |
| KR | 2001-0004005 | 1/2001 |

*Primary Examiner* — William Boddie
*Assistant Examiner* — Leonid Shapiro
(74) *Attorney, Agent, or Firm* — Jianq Chyun IP Office (57) ABSTRACT

A pixel array having a plurality of pixel structures is provided. At least one of the pixel structures includes a scan line, a data line, an active device, a pixel electrode, a capacitor electrode line, a readout line and a sensing device. The scan line and the data line are disposed on a substrate. The active device is electrically connected to the scan line and the data line. The pixel electrode is electrically connected to the active device. The capacitor electrode line electrically couples with the pixel electrode. The readout line is disposed parallel to the data line. The sensing device is electrically connected to the scan line and the readout line, and the sensing device is connected to an adjacent capacitor electrode line.

14 Claims, 5 Drawing Sheets

(56) References Cited

U.S. PATENT DOCUMENTS

| | | |
|---|---|---|
| 2003/0156230 A1 | 8/2003 | Boer et al. |
| 2003/0218116 A1 | 11/2003 | Boer |
| 2005/0200296 A1 | 9/2005 | Naugler et al. |
| 2006/0232543 A1* | 10/2006 | Kobayashi et al. ........... 345/100 |
| 2007/0296685 A1* | 12/2007 | Kang et al. .................... 345/102 |
| 2009/0135158 A1* | 5/2009 | Takahashi et al. ............ 345/174 |

* cited by examiner

PIXEL ARRAY AND DISPLAY PANEL HAVING THE SAME

CROSS-REFERENCE TO RELATED APPLICATION

This application is a continuation in part of and claims the priority benefit of patent application Ser. No. 11/536,403, filed on Sep. 28, 2006, which claims the priority benefit of Taiwan application No. 94135169, filed on Oct. 7, 2005. The entirety of each of the above-mentioned applications is hereby incorporated by reference herein and made a part of this specification.

BACKGROUND OF THE INVENTION

1. Field of the Invention

The present invention relates to a pixel array and a display panel having the same. More particularly, the present invention relates to a touch sensing display panel and its pixel array.

2. Description of Related Art

In current information era, human beings by degrees tend to rely on electronic products. The electronic products such as mobile phones, handheld personal computers (PCs), personal digital assistants (PDAs) and smart phones have pervaded everywhere in our daily life. To meet current demands on portable, compact, and user-friendly information technology (IT) products, touch sensing display panels have been introduced as input devices in replacement of conventional keyboards or mice. Among the touch sensing display panels, a touch sensing display panel capable of performing both a touch function and a display function is one of the most popular products at present.

Generally speaking, the touch sensing display panels are divided into built-in touch sensing display panels and added-type touch sensing display panels. The built-in touch sensing display panel is in a form of building touch sensing devices in a display panel, while the added-type touch sensing display panel is in a form of attaching a touch sensing panel on a display panel. Because the built-in touch sensing display panels have advantage of thinness and light, it has been widely developed in recently years.

In the conventional built-in touch sensing display panels, the touch sensing devices built in the display panel may usually be affected by display devices in the display panel, so as to generate large noise or error sensing signals. Thereby, the touch sensing quality of the display panel is deteriorated.

SUMMARY OF THE INVENTION

Accordingly, the present invention is directed to a pixel array and a display panel having the same capable of improving the touch sensing quality.

The present invention provides a pixel array having a plurality of pixel structures. At least one of the pixel structures includes a scan line, a data line, an active device, a pixel electrode, a capacitor electrode line, a readout line and a sensing device. The scan line and the data line are disposed on a substrate. The active device is electrically connected to the scan line and the data line. The pixel electrode is electrically connected to the active device. The capacitor electrode line electrically couples with the pixel electrode. The readout line is disposed parallel to the data line. The sensing device is electrically connected to the scan line and the readout line, and the sensing device is connected to an adjacent capacitor electrode line.

The present invention also provides a display panel comprising a first substrate, a second substrate and a display medium disposed between the first substrate and the second substrate. The first substrate comprises a plurality of pixel structures thereon, and at least one of the pixel structures includes a scan line, a data line, an active device, a pixel electrode, a capacitor electrode line, and readout line and a sensing device. The scan line and the data line are disposed on a substrate. The active device is electrically connected to the scan line and the data line. The pixel electrode is electrically connected to the active device. The capacitor electrode line electrically couples with the pixel electrode. The readout line is disposed parallel to the data line. The sensing device is electrically connected to the scan line and the readout line, and the sensing device is connected to an adjacent capacitor electrode line.

In light of the foregoing, the sensing device is connected to the adjacent capacitor electrode line, rather than connected to the capacitor electrode line electrically coupling with the pixel electrode of the pixel structure. Therefore, when the active device of the pixel structure is turned-on and the pixel electrode of the pixel structure electrically couples with the capacitor electrode line, the sensing device is not affected by said coupling effect because the sensing device is not connected to the said capacitor electrode line.

In order to make the aforementioned and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1:
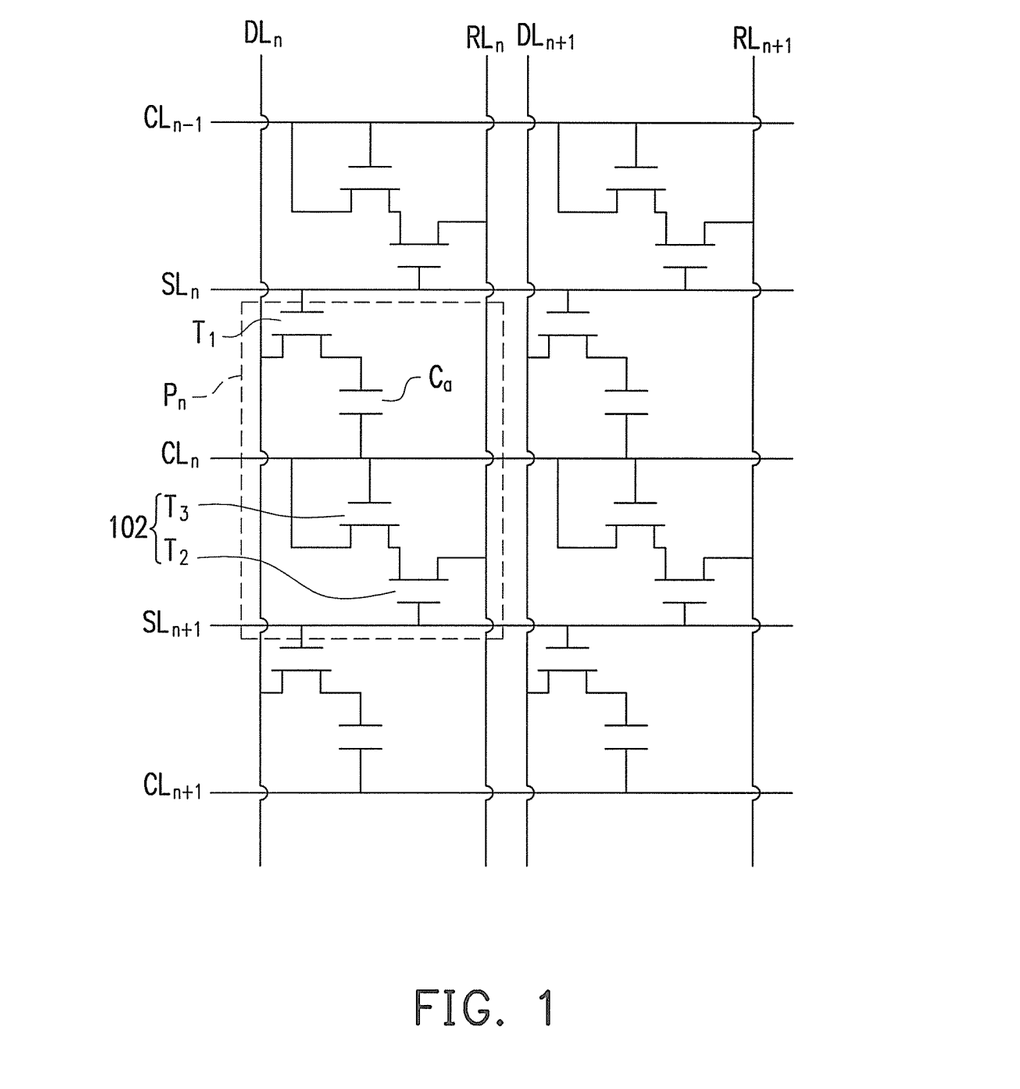
FIG. 1 shows an equivalent circuitry of a pixel array according to an embodiment of the present invention.
Figure 2:
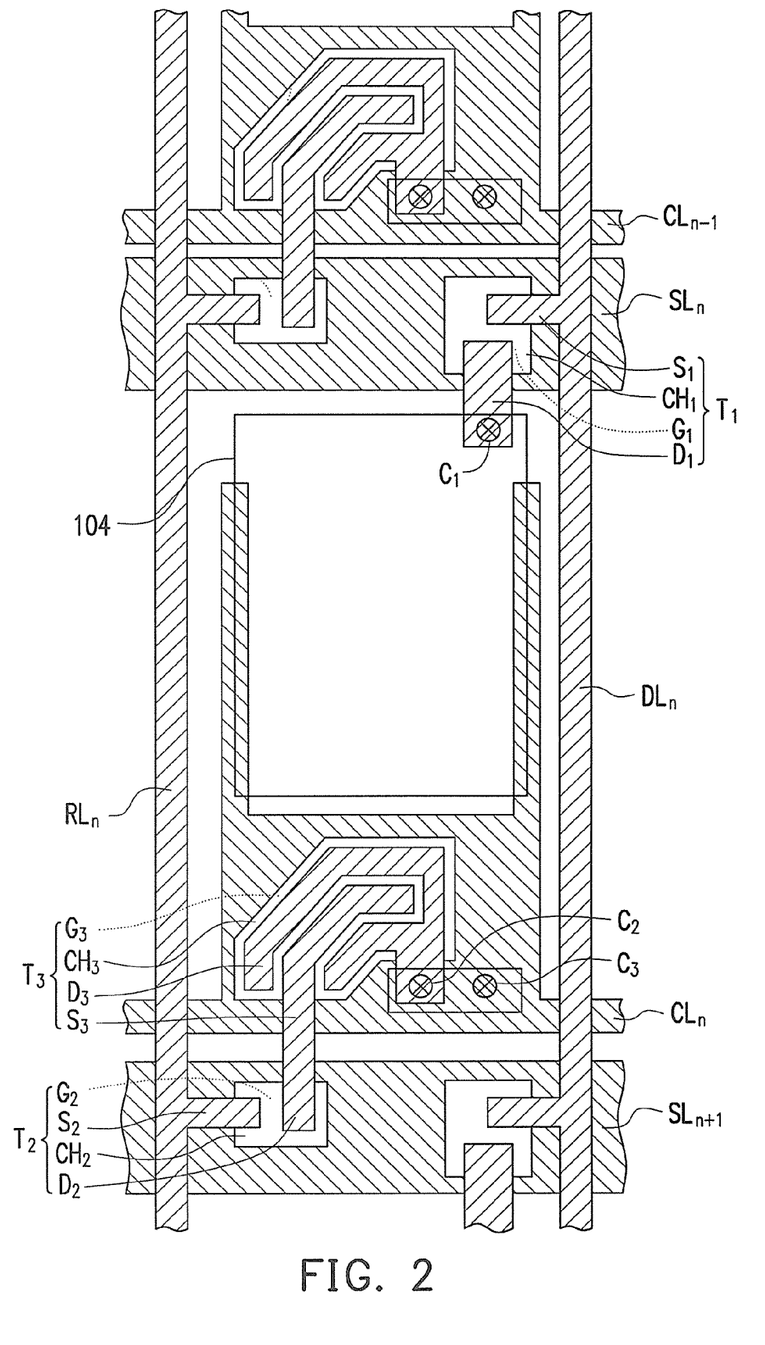
FIG. 2 is a schematic top view of one pixel structure of the pixel array in FIG.

FIG. 1 shows an equivalent circuitry of a pixel array according to an embodiment of the present invention. FIG. 2 is a schematic top view of one pixel structure of the pixel array in FIG. 1. Referring to FIG. 1 and FIG. 2, the pixel array has a plurality of pixel structures $P_n$. At least one of the pixel structures $P_n$ includes a scan line $SL_n$, a data line $DL_n$, an active device $T_1$, a pixel electrode 104, a capacitor electrode line $CL_n$, a readout line $RL_n$ and a sensing device 102. More specifically, the pixel array comprises a plurality of scan lines ($SL_1, \ldots, SL_{n-1}, SL_n, SL_{n+1} \ldots$), a plurality of data lines ($DL_1, \ldots, DL_{n-1}, DL_n, DL_{n+1} \ldots$), a plurality of readout lines ($RL_1, RL_{n-1}, RL_n, RL_{n+1} \ldots$) and a plurality of capacitor electrode lines ($CL_1, \ldots, CL_{n-1}, CL_n, CL_{n+1} \ldots$). In the embodiment, each pixel structure $P_n$, has one active device $T_1$, one pixel electrode 104 and one sensing device 102.

However, the present invention does not limit to this embodiment and does not limit the number of the active device $T_1$, the number of the pixel electrode 104 and the number of the sensing device 102. According to another embodiment (not shown), each pixel structure may have the active device and the pixel electrode, and the sensing devices are only disposed in parts of the pixel structures.

In the pixel structure $P_n$ according to the embodiment, the scan line $SL_n$ and the data line $DL_n$ are disposed on a substrate (not shown in FIG. 1 and FIG. 2). The scan line $SL_n$ has an extending direction different from that of the data line $DL_n$. In addition, the scan line $SL_n$ and the data line $DL_n$ are disposed in different film layers, and an insulating layer (not shown) is sandwiched therebetween so as to electrically isolate the scan line $SL_n$ and the data line $DL_n$. The scan line $SL_n$ and the data line $DL_n$ are used to transmit the driving signals for the pixel structure $P_n$.

The active device $T_1$ of the pixel structure $P_n$ is electrically connected to the scan line $SL_n$ and the data line $DL_n$. Herein, the active device $T_1$ is a thin film transistor comprising a gate $G_1$, a channel $CH_1$, a source $S_1$ and a drain $DL_1$. The gate $G_1$ is electrically connected to the scan line $SL_n$, the source $S_1$ is electrically connected to the data line $DL_n$. The channel $CH_1$ is disposed above the gate $G_1$ and under the source $S_1$ and the drain $DL_1$. In the embodiment, the active device $T_1$ is a bottom gate thin film transistor for illustration, but it is not limited in the present invention. According to the present embodiment, the active device $T_1$ is, for example, a top-gate thin film transistor.

The pixel electrode 104 is electrically connected to the active device $T_1$. In the embodiment, the pixel electrode 104 is electrically connected to the drain $DL_1$ of the active device $T_1$ through a contact hole $C_1$ formed at an overlapping region between the drain $DL_1$ and the pixel electrode 104. The pixel electrode 104 is made of a transparent conductive material, such as Indium Tin Oxide (ITO) or Indium Zinc Oxide (IZO), or a reflective conductive material, such as a metal. The pixel electrode 104 may also be formed by a combination of a transparent conductive material and a reflective conductive material (not shown), so as to form a transflective pixel structure.

The capacitor electrode line $CL_n$ is disposed on the substrate (not shown in FIG. 1 and FIG. 2) and electrically couples with the pixel electrode 104. More specifically, the capacitor electrode line $CL_n$ is disposed under the pixel electrode 104, and at least one insulating layer (not shown) is between the capacitor electrode line $CL_n$ and the pixel electrode 104. However, the capacitor electrode line $CL_n$ and the pixel electrode 104 have an overlapping region, and the capacitor electrode line $CL_n$ electrically couples with the pixel electrode 104 at this overlapping region. Hence, the electric charges of the pixel electrode 104 can be stored therein, so as to form a storage capacitor $C_a$ of the pixel structure $P_n$. In this embodiment, the capacitor electrode line $CL_n$ includes a main part and two branches extending from the main part, the main part has an extending direction parallel to the scan line $SL_n$ and the two branches have an extending direction parallel to the data line $DL_n$. However, the present invention does not limit the shape or layout of the capacitor electrode line $CL_n$. Moreover, in the embodiment, the capacitor electrode line $CL_n$ and the scan line $SL_n$ are formed simultaneously, and thus the capacitor electrode line $CL_n$ and the scan line $SL_n$ are in the same layer. According to an embodiment, capacitor electrode lines ($CL_1, \ldots, CL_{n-1}, CL_n, CL_{n+1} \ldots$) in the pixel structures are electrically connected to a common voltage. The common voltage may be a direct current voltage, for example.

The readout line $RL_n$ is disposed parallel to the data line $DL_n$. More specifically, the readout line $RL_n$ is electrically isolated from the data line $DL_n$. According to the embodiment, the readout line $RL_n$ and data line $DL_n$ are formed at the same time, and thus the readout line $RL_n$ and data line $DL_n$ are in the same layer. In addition, the readout line $RL_n$ may have a extending direction different form that of the scan line $SL_n$ and the capacitor electrode line $CL_n$, and an insulating layer (not shown) is formed between the readout line $RL_n$ and the scan line $SL_n$ and capacitor electrode line $CL_n$.

The sensing device 102 is electrically connected to the scan line $SL_{n+1}$ and the readout line $RL_n$ and the sensing device 102 is connected to an adjacent capacitor electrode line $CL_n$. According to the embodiment, the sensing device 102 comprises a switch device $T_2$ and a photo sensor device $T_3$. The switch device $T_2$ is electrically connected to the scan line $SL_{n+1}$ and the readout line $RL_n$ while the photo sensor device $T_3$ is electrically connected to the switch device $T_2$ and connected with the adjacent capacitor electrode line $CL_n$. More specifically, the switch device $T_2$ comprises a gate $G_2$, a channel $CH_2$, a source $S_2$ and a drain $DL_2$, and the photo sensor device $T_3$ comprises a gate $G_3$, a channel $CH_3$, a source $S_3$ and a drain $DL_3$. In the switch device $T_2$, the channel $CH_2$ is disposed above the gate $G_2$ and under the source $S_2$ and the drain $DL_2$. In the photo sensor device $T_3$, the channel $CH_3$ is disposed above the gate $G_3$ and under the source $S_3$ and the drain $DL_3$. The gate $G_2$ of the switch device $T_2$ is electrically connected to the scan line $SL_{n+1}$, the drain $DL_2$ of the switch device $T_2$ is electrically connected to the source $S_3$ of the photo sensor device $T_3$, the source $S_2$ of the switch device $T_2$ is electrically connected to the readout line $RL_n$, and the gate $G_3$ and the drain $DL_3$ of the photo sensor device $T_3$ are connected to the adjacent capacitor electrode line $CL_n$. In particular, the source $S_3$ of the photo sensor device $T_3$ is connected to the adjacent capacitor electrode line $CL_n$ through the contact windows $C_2$ and $C_3$. In the embodiment, the switch device $T_2$ and the photo sensor device $T_3$ are respectively a bottom gate thin film transistor for illustration, but it is not limited in the present invention. According to the present embodiment, the switch device $T_2$ and the photo sensor device $T_3$ may respectively be a top-gate thin film transistor, for example. Skilled persons in the art will understand that the drain and the source of a thin film transistor may be exchangeable, depending on the voltage levels to which they are connected.

It is should be noted that the photo sensor device $T_3$ of the pixel structure $P_n$, is connected to the adjacent scan line $SL_{n+1}$, rather than connected to the scan line $SL_n$ which electrically couples with the pixel electrode 104 of the pixel structure P. Therefore, when the active device $T_1$ of the pixel structure $P_n$ is turned-on, the photo sensor device $T_3$ of the sensing device 102 is not affected because the photo sensor device $T_3$ of the sensing device 102 is not connected to the said scan line $SL_n$. In other words, the sensing device and the active device electrically coupled with the same scan line are not affected by each other because the coupling effect would be balanced by the common voltage (direct current voltage) applied on the capacitor electrode lines ($CL_1, \ldots, CL_{n-1}, CL_n, CL_{n+1} \ldots$). The active device $T_1$ is connected to the capacitor electrode lines $CL_n$ and the sensing device coupled with the same scan line $SL_n$ is connected to the adjacent capacitor electrode line $CL_{n-1}$, and therefore the photo sensor device $T_3$ of the sensing device 102 is not affected by the coupling effect in the pixel structure $P_n$ and may output a stabilized sensing signal to the readout line $RL_n$ through the switch device $T_2$.

Figure 3:
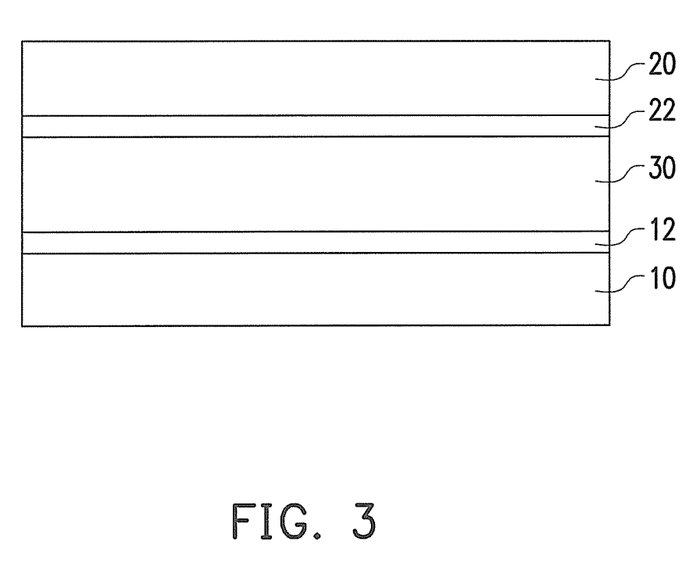
FIG. 3 is a schematic cross-sectional view of a display panel according to an embodiment of the present invention.

FIG. 3 is a schematic cross-sectional view of a display panel according to an embodiment of the present invention. Referring to FIG. 3, the display panel of the embodiment comprises a first substrate 10, a second substrate 20 and a display medium 30 disposed between the first substrate 10 and the second substrate 20.

The first substrate 10 can be made of glass, quartz, an organic material or a metal. The first substrate 10 has a pixel array 12 thereon, and the pixel array 12 may be the pixel array as shown in FIG. 1.

The second substrate 20 can be made of glass, quartz, an organic material or the like. In the embodiment, the second substrate 20 has an electrode layer 22 disposed thereon. The electrode layer 22 can be a transparent electrode layer and can be, for example, made of indium tin oxide (ITO) or indium zinc oxide (IZO). The electrode layer 22 completely covers the second substrate 20 and is electrically connected to a common voltage, such as a direct current voltage. In addition, according to another embodiment, a color filter layer (not shown), which comprises red, green and blue filter patterns, can also be disposed on the second substrate 20. Moreover, a light shielding pattern layer (not shown) may also be disposed on the second substrate 20 and disposed between the patterns of the color filter array, and it is also called a black matrix.

In the embodiment, the display medium 30 disposed between the first substrate 10 and the second substrate 20 comprises a liquid crystal material. However, the present invention does not limit herein. The display medium 30 may also be other display materials, such as an organic light emitting material, an electrophoretic display material or a plasma display material.

Figure 4:
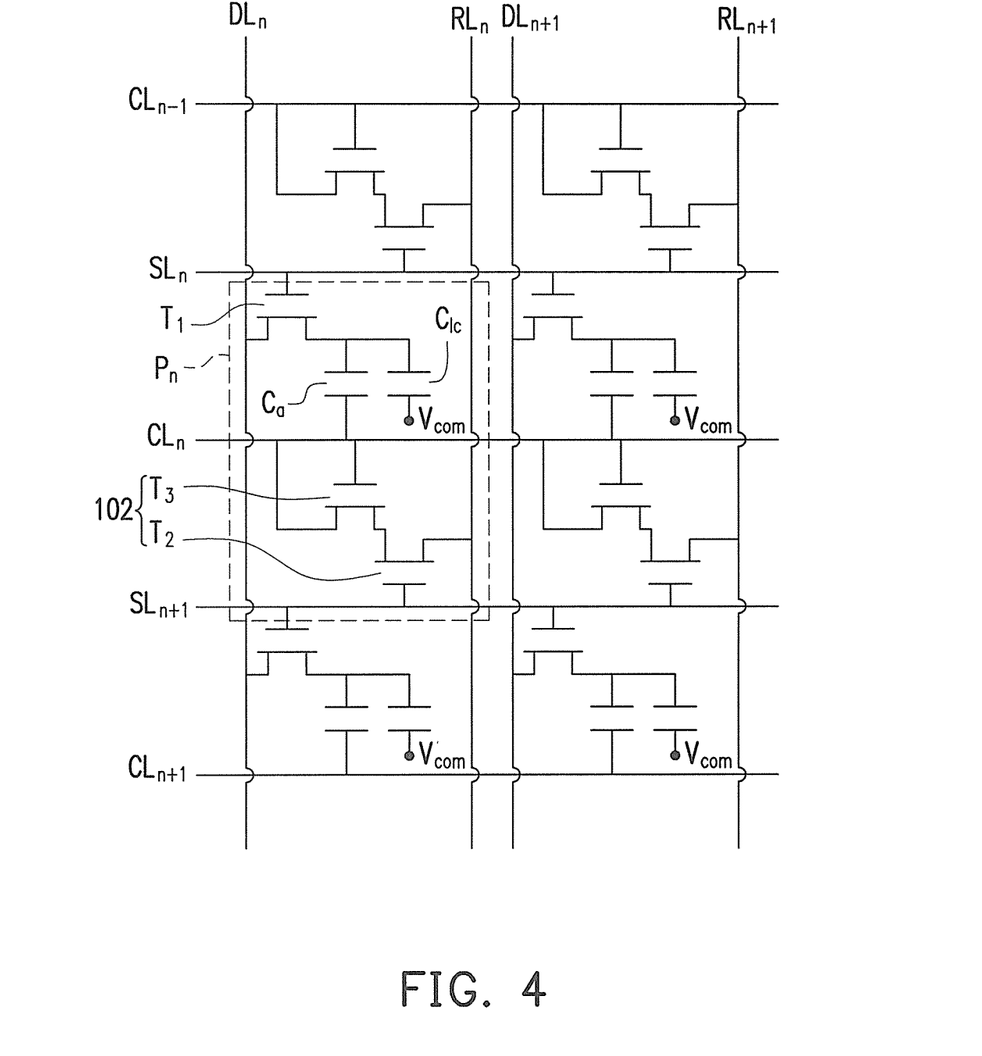
FIG. 4 shows an equivalent circuitry of pixel units of the display panel in FIG.

After the first substrate 10, the second substrate 20 and the display medium 30 are assembled to form a display panel as shown in FIG. 3, a plurality of pixel units (as shown in FIG. 4) are formed, wherein each pixel unit corresponds to one of the pixel structures (as shown in FIG. 1). In FIG. 4, an equivalent circuitry of pixel units of the display panel in FIG. 3 is shown. Referring to FIG. 4, in addition to the pixel structure $P_n$, (as shown in FIG. 1), a liquid crystal capacitor $C_{lc}$ is also formed in each pixel unit. That is to say, each pixel unit of FIG. 4 comprises a pixel structure of FIG. 1 and a liquid crystal capacitor $C_{lc}$. The liquid crystal capacitor $C_{lc}$ is formed by the pixel electrode of the pixel structure $P_n$ on the first substrate 10 (as shown in FIG. 3), the electrode layer 22 on the second substrate 20 and the liquid crystal material 30 between the pixel structure $P_n$ and the electrode layer 22.

According to the embodiment, the electrode layer 22 on the second substrate 20 is electrically connected to a common voltage ($V_{com}$), such as a direct current voltage. The capacitor electrode lines ($CL_1, \ldots, CL_{n-1}, CL_n, CL_{n+1} \ldots$) are also electrically connect to this common voltage ($V_{com}$), such as the direct current voltage. Therefore, one end of the liquid crystal capacitor $C_{lc}$ of each pixel unit is electrically connected to the common voltage ($V_{com}$).

In the above-mentioned embodiment, the photo sensor device $T_3$ of the pixel structure $P_n$, is connected to the adjacent capacitor electrode line $CL_{n+1}$, rather than electrically connected to the capacitor electrode line $CL_n$ which electrically couples with the pixel electrode 104 of the pixel structure $P_n$. However, the present invention does not limit to the embodiment. According to another embodiment, the photo sensor device $T_3$ of the pixel structure $P_n$ can also be connected another adjacent capacitor electrode line $CL_{n+1}$.

Figure 5:
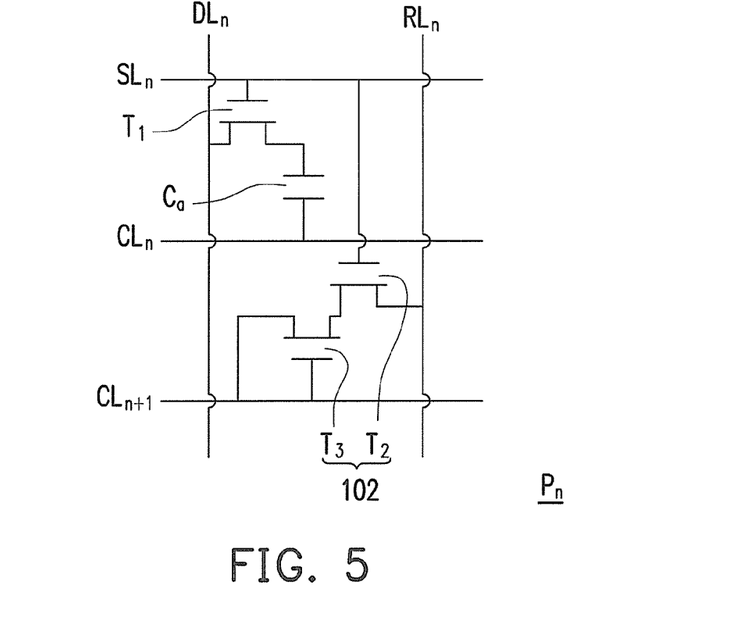
FIG. 5 shows an equivalent circuitry of a pixel structure according to another embodiment of the present invention.

FIG. 5 shows an equivalent circuitry of a pixel structure according to another embodiment of the present invention. The embodiment shown in FIG. 5 is similar to the embodiment shown in FIG. 1 so that components identical to those of FIG. 1 will be denoted with the same numerals in FIG. 5 and not repeated herein. The difference between the embodiment of FIG. 5 and the embodiment of FIG. 1 is that the photo sensor device $T_3$ of the pixel structure $P_n$ is connected to an adjacent capacitor electrode line $CL_{n+1}$. Even though FIG. 5 only shows one pixel structure $P_n$ of a pixel array, the people skilled in the art can understand the pixel array constituted by the pixel structure $P_n$ of FIG. 5 according to the description of the embodiment of FIG. 1. In this embodiment, each pixel structure $P_n$ of the pixel array may comprised of one sensing device 102. However, according to another embodiment (not shown), only parts of the pixel structures comprise the sensing devices 102 therein.

Similarly, in the embodiment of FIG. 5, the photo sensor device $T_3$ of the pixel structure $P_n$ is connected to the adjacent capacitor electrode line $CL_{n+1}$, rather than connected to the capacitor electrode line $CL_n$ which is one end of the storage capacitor $C_a$ of the pixel structure $P_n$. When the active device $T_1$ of the pixel structure $P_n$ is turned-on and the storage capacitor $C_a$ of the pixel structure $P_n$ is electrically charged (or electrically coupled), the photo sensor device $T_3$ of the sensing device 102 is not affected by said charging (or coupling) effect because the photo sensor device $T_3$ of the sensing device 102 is not connected to the said capacitor electrode line $CL_n$. In details, when the active device $T_1$ of the pixel structure $P_n$ is turned-on and the storage capacitor $C_a$ of the pixel structure $P_n$ is electrically charged (or electrically coupled), the switch device $T_2$ of the sensing device 102 is also turn-on since the switch device $T_2$ of the sensing device 102 is electrically connected to the scan line $SL_n$. However, the photo sensor device $T_3$ of the sensing device 102 is not affected by said charging (or coupling) effect because the charging (or coupling) effect would be balanced by the common voltage (direct current voltage) applied on the capacitor electrode lines ($CL_1, \ldots, CL_{n-1}, CL_n \, CL_{n+1}, \ldots$) before it is transmitted to the adjacent capacitor electrode line $CL_{n+1}$. In other words, at the meanwhile, the adjacent capacitor electrode line $CL_{n+1}$, connecting to the photo sensor device $T_3$ of the sensing device 102 has a stabilized common voltage, and therefore the photo sensor device $T_3$ of the sensing device 102 is not affected by the coupling effect in the pixel structure $P_n$ and may output a stabilized sensing signal to the readout line $RL_n$ through the switch device $T_2$.

Figure 6:
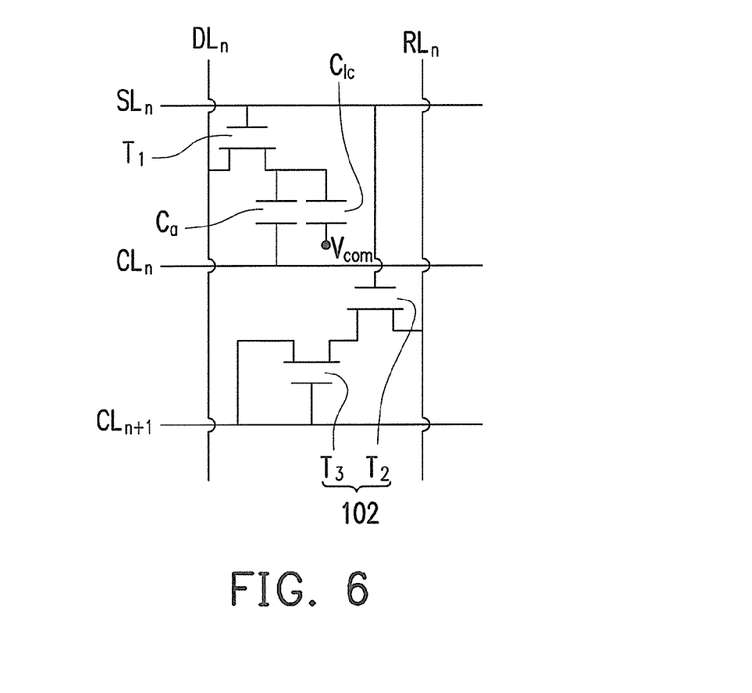
FIG. 6 shows an equivalent circuitry of a pixel unit of the display panel having the pixel structure of FIG. 5.

FIG. 6 shows an equivalent circuitry of a pixel unit of the display panel having the pixel structure of FIG. 5. If the pixel structure $P_n$ of FIG. 5 is used in a display panel, a pixel unit of the display panel corresponding to the pixel structure $P_n$ of FIG. 5 is as shown in FIG. 6. That means, each pixel unit of FIG. 6 comprises a pixel structure $P_n$, of FIG. 5 and a liquid crystal capacitor $C_{lc}$. The liquid crystal capacitor $C_{lc}$ is formed by the pixel electrode of the pixel structure $P_n$ the electrode layer 22 and the liquid crystal material 30 disposed therebetween. Similarly, one end of the liquid crystal capacitor $C_{lc}$ of each pixel unit is electrically connected to the common voltage ($V_{com}$).

To sum up, the sensing device is connected to the adjacent capacitor electrode line, rather than connected to the capacitor electrode line which electrically couples with the pixel electrode of the pixel structure. Therefore, when the active device is turned-on and the pixel electrode of the pixel structure electrically couples with the capacitor electrode line, the sensing device is not affected by said coupling effect because the sensing device is not connected to the said capacitor electrode line. As a result, too large noise or error sensing signals generated from the display devices in the display panel can be avoided, so as to improve the touch sensing quality of the display panel.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel array comprising a plurality of pixel structures, at least one of the pixel structures comprising:
   a scan line and a data line, disposed on a substrate;
   an active device, electrically connected to the scan line and the data line;
   a pixel electrode, electrically connected to the active device;
   a capacitor electrode line, electrically coupling with the pixel electrode;
   a readout line, disposed parallel to the data line; and
   a sensing device, electrically connected to the scan line and the readout line, wherein the sensing device is connected to an adjacent capacitor electrode line, the active device of the pixel structure is electrically connected to the $n_{th}$ scan line and the $n_{th}$ data line, the pixel electrode electrically couples with the $n_{th}$ capacitor electrode line, and the sensing device is connected to the $(n+1)_{th}$ capacitor electrode line.

2. The pixel array as claimed in claim 1, wherein the sensing device comprises:
   a switch device, electrically connected to the scan line and the readout line; and
   a photo sensor device, electrically connected to the switch device and connected to the adjacent capacitor electrode line.

3. The pixel array as claimed in claim 2, wherein the switch device and the photo sensor device respectively comprise a gate, a source and a drain, the gate of the switch device is electrically connected to the scan line, the drain of the switch device is electrically connected to the source of the photo sensor device, the source of the switch device is electrically connected to the readout line, and the gate and the drain of the photo sensor device are connected to the adjacent capacitor electrode line.

4. The pixel array as claimed in claim 1, wherein the active device of the pixel structure is electrically connected to the $n_{th}$ scan line and the $n_{th}$ data line, the pixel electrode electrically couples with the $n_{th}$ capacitor electrode line, and the sensing device is connected to the $(n-1)_{th}$ capacitor electrode line.

5. The pixel array as claimed in claim 1, wherein the capacitor electrode line and the adjacent capacitor electrode line are electrically connected to a common voltage.

6. The pixel array as claimed in claim 5, wherein the common voltage is a direct current voltage.

7. A display panel, comprising:
   a first substrate, having a plurality of pixel structures disposed thereon, wherein at least one of the pixel structures comprises:
   a scan line and a data line, disposed on a substrate;
   an active device, electrically connected to the scan line and the data line;
   a pixel electrode, electrically connected to the active device;
   a capacitor electrode line, electrically coupling with the pixel electrode;
   a readout line, disposed parallel to the data line; and
   a sensing device, electrically connected to the scan line and the readout line, wherein the sensing device is connected to an adjacent capacitor electrode line, the active device of the pixel structure is electrically connected to the $n_{th}$ scan line and the $n_{th}$ data line, the pixel electrode electrically couples with the $n_{th}$ capacitor electrode line, and the sensing device is connected to the $(n+1)_{th}$ capacitor electrode line;
   a second substrate, opposite to the first substrate; and
   a display medium, disposed between the first substrate and the second substrate.

8. The display panel as claimed in claim 7, wherein the sensing device comprises:
   a switch device, electrically connected to the scan line and the readout line; and
   a photo sensor device, electrically connected to the switch device and connected to the adjacent capacitor electrode line.

9. The display panel as claimed in claim 8, wherein the switch device and the photo sensor device respectively comprise a gate, a source and a drain, the gate of the switch device is electrically connected to the scan line, the drain of the switch device is electrically connected to the source of the photo sensor device, the source of the switch device is electrically connected to the readout line, and the gate and the drain of the photo sensor device are connected to the adjacent capacitor electrode line.

10. The display panel as claimed in claim 7, wherein the active device of the pixel structure is electrically connected to the $n_{th}$ scan line and the $n_{th}$ data line, the pixel electrode electrically couples with the $n_{th}$ capacitor electrode line, and the sensing device is connected to the $(n-1)_{th}$ capacitor electrode line.

11. The display panel as claimed in claim 7, wherein the capacitor electrode line and the adjacent capacitor electrode line are electrically connected to a common voltage.

12. The display panel as claimed in claim 11, wherein the common voltage is a direct current voltage.

13. The display panel as claimed in claim 7, wherein the second substrate further comprises an electrode layer thereon, and the electrode layer, the capacitor electrode line and the adjacent capacitor electrode line are electrically connected to a common voltage.

14. The display panel as claimed in claim 13, wherein the common voltage is a direct current voltage.

* * * * *